United States Patent [19]
Fujino et al.

[11] Patent Number: 6,067,002
[45] Date of Patent: *May 23, 2000

[54] CIRCUIT SUBSTRATE WITH A BUILT-IN COIL

[75] Inventors: Masato Fujino, Ohmihachiman; Hidetoshi Iwatani, Shiga-ken; Kouichi Nitta, Ohmihachiman, all of Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/712,205

[22] Filed: Sep. 11, 1996

[30] Foreign Application Priority Data

Sep. 12, 1995 [JP] Japan .................................. 7-233751

[51] Int. Cl.$^7$ .............................. H01F 5/00; H01F 27/28
[52] U.S. Cl. ......................... 336/200; 336/223; 336/232
[58] Field of Search .................................. 336/200, 232, 336/223

[56] References Cited

U.S. PATENT DOCUMENTS

| | | | |
|---|---|---|---|
| 3,769,698 | 11/1973 | Lademann et al. | 29/602 |
| 4,730,241 | 3/1988 | Takaya | 363/19 |
| 4,959,631 | 9/1990 | Hasegawa | 336/83 |
| 5,430,424 | 7/1995 | Sato et al. | 336/200 |
| 5,552,756 | 9/1996 | Ushiro | 336/200 |
| 5,583,474 | 12/1996 | Mizoguchi et al. | 336/83 |
| 5,652,561 | 7/1997 | Inoh et al. | 336/200 |

FOREIGN PATENT DOCUMENTS 3-268410 11/1991 Japan .
6-66193 8/1994 Japan .

*Primary Examiner*—Lincoln Donovan
*Assistant Examiner*—Anh Mai
*Attorney, Agent, or Firm*—Ostrolenk, Faber, Gerb & Soffen, LLP

[57] ABSTRACT

A circuit substrate with a built-in coil has layers comprising respectively a wiring sheet, magnetic material, a flat coil, and magnetic material, which are overlaid. The wiring circuit sheet is made of polyimide, on which a circuit pattern is formed. The magnetic material is formed of a plurality of overlaid amorphous alloy sheets having slits and put together with adhesive. The flat coil may be formed by winding a copper wire covered with insulating film. The coil component, including the magnetic material and the flat coil, and the wiring circuit sheet are adhered to each other with the circuit pattern and the coil component being electrically connected to each other. According to one embodiment of the invention, the circuit substrate comprises a coil component with a flat coil and a pair of magnetic materials sandwiching the flat coil; and at least one wiring circuit sheet on which a circuit pattern is formed, the wiring circuit sheet being adhered to a surface of the coil component with the circuit pattern being electrically connected to the coil component.

19 Claims, 4 Drawing Sheets

CIRCUIT SUBSTRATE WITH A BUILT-IN COIL

BACKGROUND OF THE INVENTION

1. Field of the Invention

This invention relates to a circuit substrate with a built-in coil in which a coil component serving, for example, as a transformer or a choke coil is included.

2. Description of the Related Art

Along with the recent reductions in the size and weight of electronic equipment, power supplies such as DC-to-DC converters are also being reduced in size, particularly in regard to their thickness. FIGS. 7 and 9 show a side view and a perspective view of a conventional DC-to-DC converter. A DC-to-DC converter 50 has a circuit substrate 51, a coil component 52 fixed on the back surface of the circuit substrate 51, and electronic components 53 and a circuit pattern 55 provided on the front surface of the circuit substrate 51. Separate clip-type terminals 54 are mounted on edges of the circuit substrate 51 in contact with the circuit pattern 55. The circuit substrate 51 is made of a material such as alumina. The coil component 52 is formed by sandwiching a flat coil between sheet-shaped magnetic materials made of amorphous alloy foil. The electronic components 53 include field-effect transistors, diodes, integrated circuits, resistors, and so forth. The electronic components 53 and the circuit pattern 55 form a circuit.

The overall thickness of the above-described DC-to-DC converter is increased by the thickness of the coil component 52 which is fixed on the back surface of the circuit substrate. Thus, the ability to further reduce the thickness of the circuit substrate 51 is to some extent limited. For this reason, the overall thickness of a power supply such as a DC-to-DC converter is difficult to reduce.

SUMMARY OF THE INVENTION

To this end, it is an object of the present invention to provide a thin, compact circuit substrate with a built-in coil.

To achieve the above object, in accordance with a feature of the present invention, there is provided a circuit substrate with a built-in coil comprising: a coil component in which at least one flat coil and magnetic material are overlaid; and a wiring circuit sheet on which a circuit pattern is provided, the coil component and the circuit pattern on the wiring circuit sheet being electrically connected to each other. The use of the wiring circuit sheet and the coil component in which the flat coil and the magnetic material are overlaid enables the coil component to be included in the circuit substrate.

The magnetic materials may comprise metallic magnetic materials. The use of a metallic magnetic material enables the circuit substrate to have sufficient mechanical strength even when the coil component is thin.

Preferably, the coil component and the wiring circuit sheet are impregnated with an insulating resin. Impregnating the coil component and the wiring circuit sheet with an insulating resin enables them to be firmly fixed.

Further, terminals may be provided along the sides and bottom of the coil component. Providing the terminals along the sides and the bottom of the coil component enables the terminals to be formed without enlarging the area of the circuit substrate. In general, since electrode patterns for connecting terminals to a circuit substrate are formed on the substrate, the remaining area of the circuit substrate where the electrode patterns are not formed becomes too small to mount other components. Therefore, the area of the circuit substrate must be enlarged in order to add terminals. On the other hand, an advantage of the present invention is that since the electrode patterns that form the terminals are formed along the side and the bottom of the circuit substrate, the remaining area of the circuit substrate where the electrode patterns are not formed remains sufficient to mount other components. Thus the area of the circuit substrate does not have to be enlarged to accommodate the terminals.

Other features and advantages of the present invention will become apparent from the following description of the invention which refers to the accompanying drawings.

DESCRIPTION OF THE PREFERRED EMBODIMENTS

Figure 1:
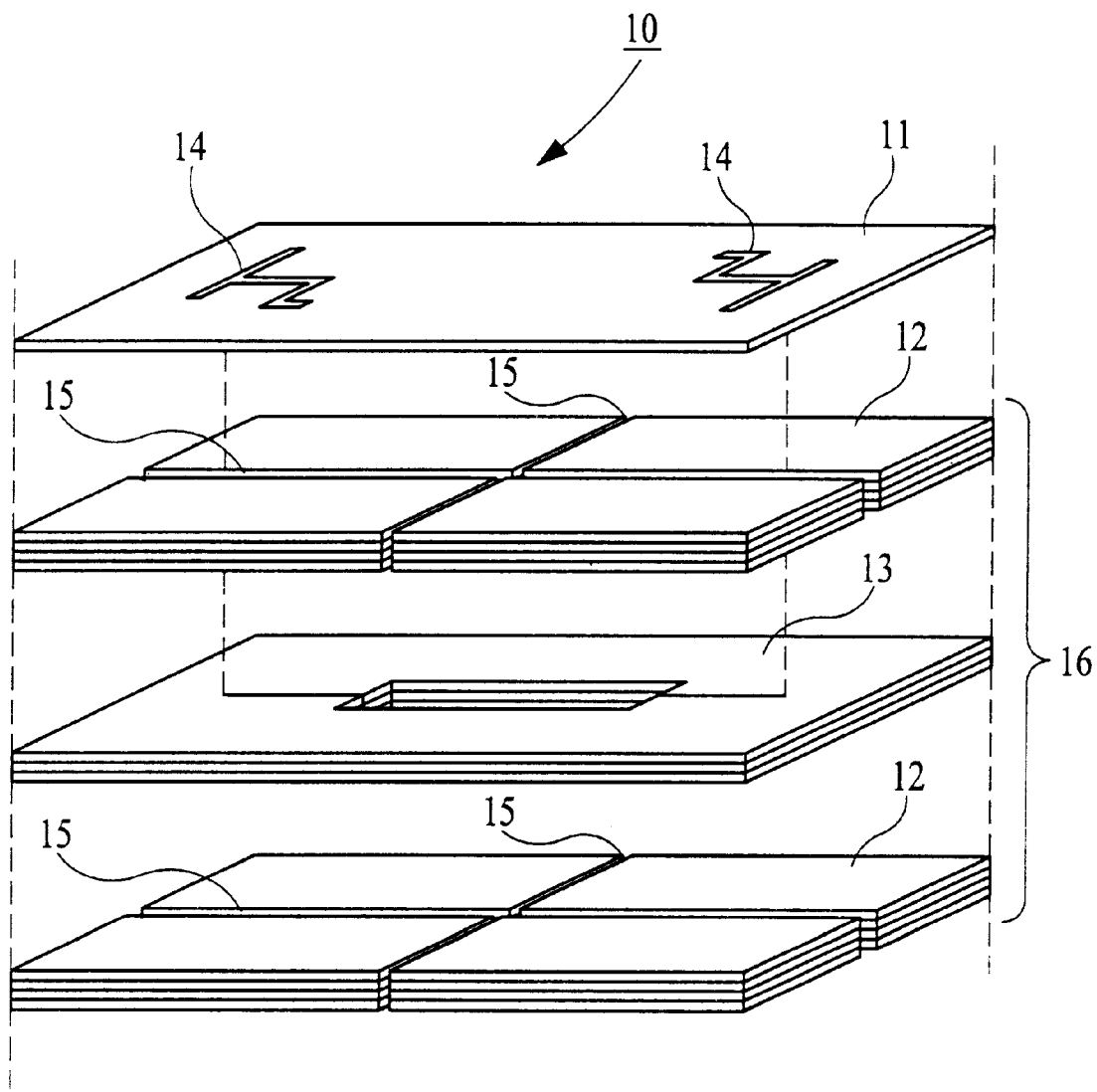
FIG. 1 is an exploded perspective view of a circuit substrate with a built-in coil in accordance with a first embodiment of the present invention.

By referring to the attached drawings, embodiments of the present invention will be described below. In each embodiment, parts that are the same as or similar to those in another embodiment are denoted by the same reference numerals, and the detailed description thereof will be omitted.

Figure 2:
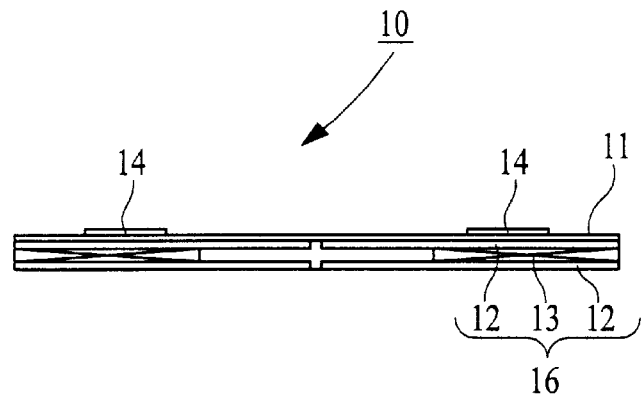
FIG. 2 is a side view of the circuit substrate with a built-in coil shown in FIG. 1.

FIG. 1 is an exploded perspective view of a circuit substrate with a built-in coil in accordance with the first embodiment of the present invention. FIG. 2 is a side view of this circuit substrate. As shown in FIGS. 1 and 2, a circuit substrate with a built-in coil 10 is formed by overlaying a wiring circuit sheet 11, a magnetic material 12, a flat coil 13, and a magnetic material 12. The wiring circuit sheet 11, the magnetic materials 12, and the flat coil 13 are insulated from each other by insulators provided therebetween, such as adhesives or films.

The wiring sheet 11 is a flexible sheet made of a material such as polyimide. On one surface of the wiring sheet 11, a circuit pattern 14 is formed.

The magnetic material 12 is formed of metallic magnetic sheets having slits 15, and a plurality of sheets made of materials such as amorphous alloys and permalloy, for example, are overlaid and bonded with adhesives provided in the interlayers. The sheets are mutually insulated by insulators provided therebetween, such as adhesives or films. The flat coil 13 is formed by, for example, winding a copper wire covered with insulating film.

A coil component 16 is formed by sandwiching the flat coil 13 between the magnetic materials 12. The coil component 16 and the circuit pattern 14 formed on the wiring circuit sheet 11 are electrically connected to each other by adhering the coil component 16 to the wiring circuit sheet 11 and providing a suitable electrical connection between the circuit pattern 14 and the flat coil 13. For example, leads of the flat soil 13 may be electrically connected to a portion of the circuit pattern 14 on the underside of the circuit sheet 11.

In accordance with the first embodiment, by overlaying the flat coil 13, and the metallic magnetic materials 12 having slits 15, the coil component 16 is formed. The coil component 16 and the flexible wiring circuit sheet 11 are put together to form the circuit substrate 10. Thereby the circuit substrate has a built-in coil. Accordingly, compared with the conventional circuit substrate, on which a coil component is fixed below the circuit substrate made of alumina or the like, the thickness of the circuit substrate can be reduced without reducing the mechanical strength.

Because an amorphous alloy, which is a metallic magnetic material, is used as the magnetic material 12, the mechanical strength of the circuit substrate is enhanced. The circuit substrate does not break due to a warp in a printed circuit board on which the circuit substrate is mounted. Further, the enhanced mechanical strength enables the circuit substrate to be enlarged, which in turn enables the coil component to have a large inductance.

The wiring circuit sheet 11 and the magnetic material 12, and the magnetic materials 12 and the flat coil 13, are insulated from each other by the insulators provided therebetween, such as the adhesives or films.

Figure 3:
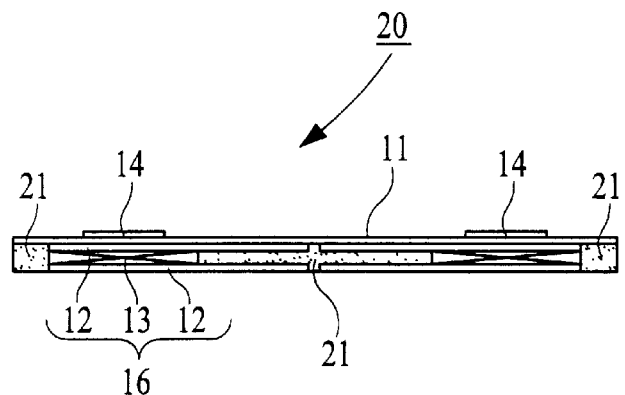
FIG. 3 is a side view of a circuit substrate with a built-in coil in accordance with a second embodiment of the present invention.

FIG. 3 is a side view of a circuit substrate with a built-in coil 20 in accordance with a second embodiment of the present invention, which differs from the circuit substrate 10 according to the first embodiment in that the coil component 16 and the wiring circuit sheet 11 are impregnated with an insulating resin 21 such as an epoxy resin or a silicone resin.

In the above-described second embodiment, impregnating the coil component 16 and the wiring circuit sheet 11 with the insulating resin 21 causes the mechanical strength of the circuit substrate 20 to increase, in addition to the same advantages as in the first embodiment.

The coil component 16 and the wiring circuit sheet 11 are thus firmly fixed to each other. The metallic magnetic material 12 made of an amorphous alloy also has enhanced corrosion resistance. Therefore, a stable-quality circuit substrate having a built-in coil is obtained.

Figure 4:
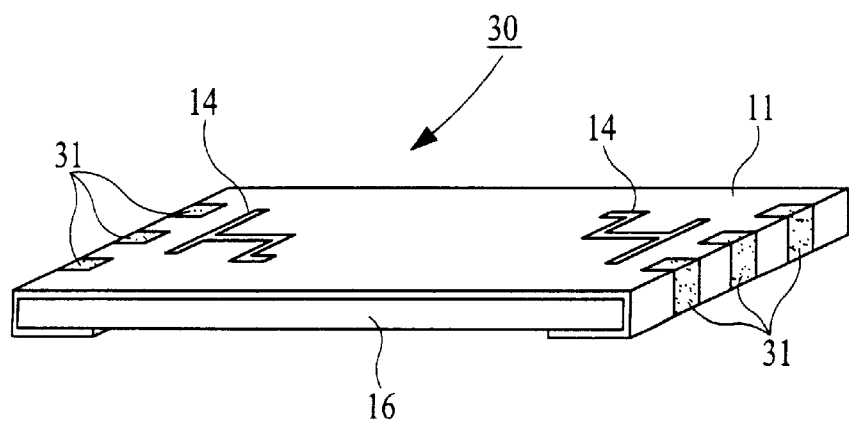
FIG. 4 is a perspective view of a circuit substrate with a built-in coil in accordance with a third embodiment of the present invention.
Figure 5:
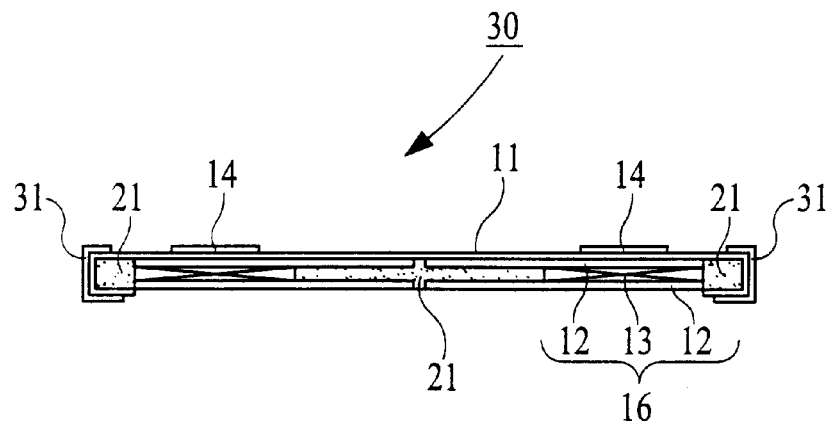
FIG. 5 is a side view of the circuit substrate with a built-in coil shown in FIG. 4.
Figure 8:
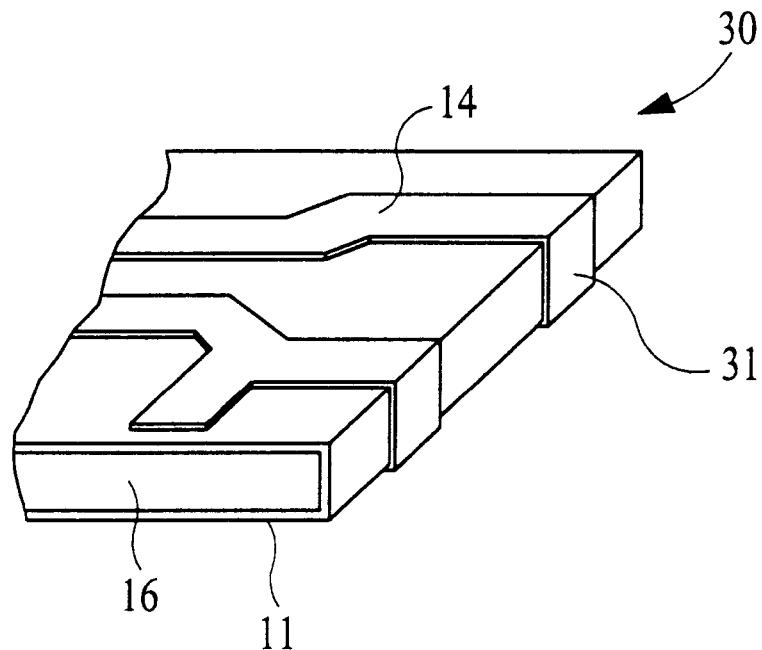
FIG. 8 is an enlarged perspective view of the circuit substrate with a built-in coil shown in FIG. 4.
Figure 9:
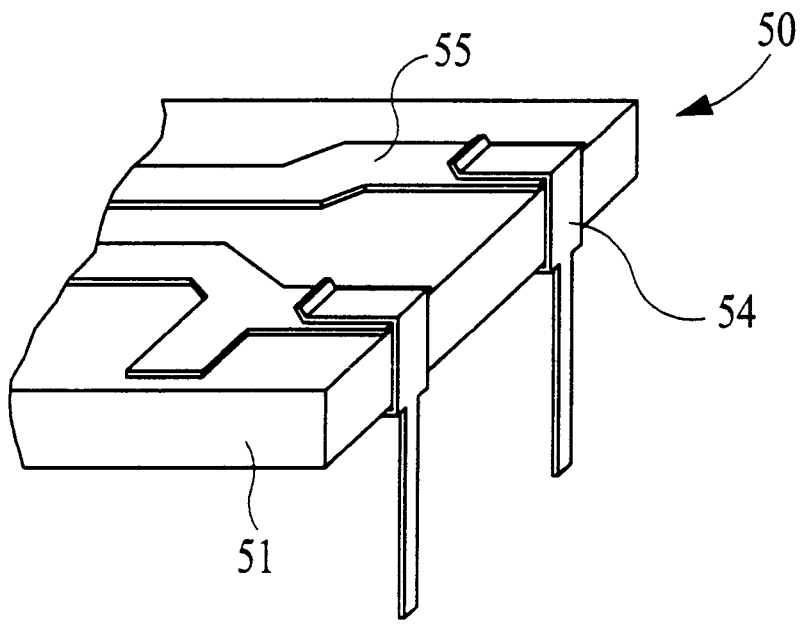
FIG. 9 is an enlarged perspective view of the conventional circuit substrate shown in FIG. 7.

FIG. 4 is a perspective view of a circuit substrate with a built-in coil in accordance with a third embodiment of the present invention. FIG. 5 is a side view and FIG. 8 is an enlarged perspective view of this circuit substrate. Compared with the circuit substrate 20 in the second embodiment, the circuit substrate 30 has terminals 31 which extend from the top, along a side and then along the bottom thereof. These terminals 31 are formed by terminal-formation parts of the circuit pattern 14 at edges of the wiring circuit sheet 11 which are bent so that they extend down the sides and then across the bottom of the coil component 16.

Figure 6:
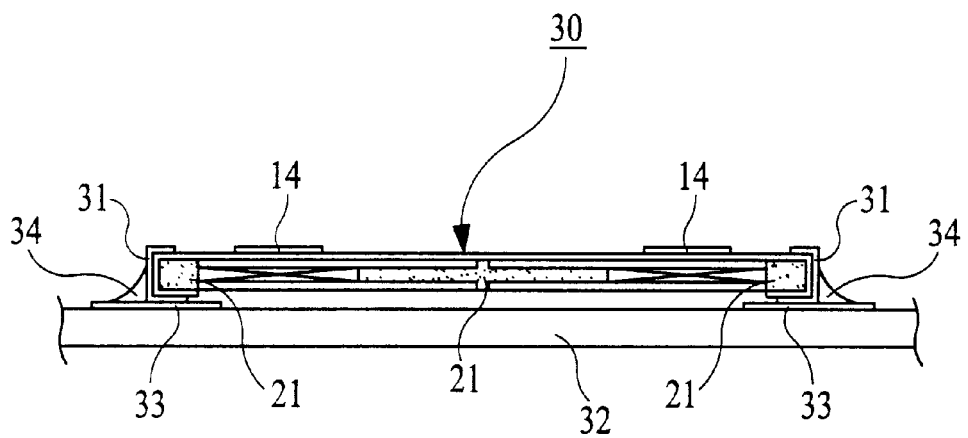
FIG. 6 is a side view of the circuit substrate with a built-in coil shown in FIG. 4 when mounted on a mounting board.
Figure 7:
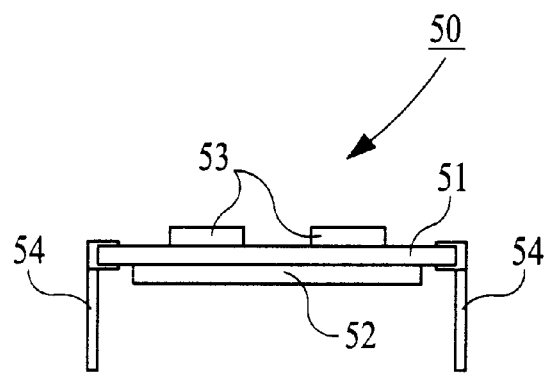
FIG. 7 is a side view of a DC-to-DC converter using a conventional circuit substrate.

FIG. 6 is a side view of the circuit substrate 30 when mounted on a printed circuit board 32. The terminals 31 of the circuit substrate 30 and the circuit pattern 33 provided on one surface of the printed board 32 are connected with solder 34.

In the third embodiment, by bending the terminal-formation parts provided at edges of the wiring circuit sheet 11 so that the parts extend across the sides and the bottom of the coil component 16, the terminals 31 are formed on the sides and the bottom of the circuit substrate 30.

Thereby, in addition to the same advantages in the second embodiment, terminals with larger connecting areas can be formed without enlarging the area of the circuit substrate 30. Accordingly, the reliability of mounting the circuit substrate 30 is enhanced because each terminal 31 on the circuit substrate 30 has a large connecting area to be used when attaching the terminal 31 to a circuit pattern 33 on the board 32.

In the first to third embodiments, a conductor made of copper wire is used in the flat coil. Such a conductor may also be formed by photoetching one surface or both surfaces of a flexible printed copper wiring board.

The flat coil may be designed in the form of a circle, a square, or an intermediate shape between them.

In the above embodiments, the wiring circuit sheet is disposed only on the top of the coil component. However, the wiring circuit sheet may alternatively be disposed on the bottom or on both surfaces of the coil component. In particular, by providing the wiring circuit sheet 11 on both surfaces to form a double-sided circuit substrate, the footprint of a circuit substrate with a built-in coil which supports a given number of other components can be made smaller than that of a conventional circuit substrate supporting the same number of components.

The slits are provided in the magnetic materials 12, in order to reduce a loss caused by a large eddy current that may be generated inside the metallic magnetic material when the flat coil 13 and the metallic magnetic material are overlaid. Consequently, providing such slits is not an essential condition for practicing the present invention.

The magnetic material 12 may be selected from various soft ferrite materials such as manganese-zinc and nickel-zinc, and metallic soft magnetic materials such as various amorphous alloys including cobalt and iron, silicon steel having superfine-texture in which an amorphous alloy is crystallized and soft magnetic materials and silicon are mainly included, permalloy, permendur, and sendust. Also, rather than a magnetic material in which a plurality of the above magnetic material films are overlaid, a magnetic material that is formed by integrally molding slurry including magnetic powder may also be used.

The coil component is fixed on the wiring circuit sheet with an adhesive, for example. A material for such an adhesive may be selected from thermoplastic resins such as vinyl resins, acrylic resins, fibers and asphalt, thermosetting resins such as epoxy resins, phenol resins, melamine resins, polyamide resins, polyester resins, alkyd resins, urethane resins and silicone resins, rubber such as acrylonitrile-butadiene rubber and rubber chloride, and minerals such as sodium silicate.

Although the present invention has been described in relation to particular embodiments thereof, many other variations and modifications and other uses will become apparent to those skilled in the art. The present invention is not limited by the specific disclosure herein.

What is claimed is:

1. A circuit substrate with a built-in coil comprising:
   a coil component comprising a flat coil and a pair of magnetic materials which have first surfaces respectively facing opposite sides of said flat coil;
   at least one wiring circuit sheet on which a circuit pattern is formed;

said wiring circuit sheet being adhered to a second surface of one of said magnetic materials of said coil component, said second surface being opposite to said first surface of said one of said magnetic materials; and said circuit pattern being electrically connected to said coil component.

2. A circuit substrate with a built-in coil according to claim 1, wherein said magnetic material comprises metallic magnetic material.

3. A circuit substrate with a built-in coil according to claim 2, wherein said coil component and said wiring circuit sheet further comprise impregnated insulating resin.

4. A circuit substrate with a built-in coil according to claim 3, further comprising terminals formed by portions of said circuit pattern which extend along the sides and the bottom of said coil component.

5. A circuit substrate with a built-in coil according to claim 3, wherein said coil component and said wiring circuit sheet are impregnated in common with a single insulating resin material.

6. A circuit substrate with a built-in coil according to claim 1, wherein said coil component and said wiring circuit sheet further comprise impregnated insulating resin.

7. A circuit substrate with a built-in coil according to claim 6, further comprising terminals formed by portions of said circuit pattern which extend along the sides and the bottom of said coil component.

8. A circuit substrate with a built-in coil according to claim 6, wherein said coil component and said wiring circuit sheet are impregnated in common with a single insulating resin material.

9. A circuit substrate with a built-in coil according to claim 1, further comprising terminals formed by portions of said circuit pattern which extend along the sides and the bottom of said coil component.

10. A circuit substrate with a built-in coil according to claim 1, wherein each said magnetic material has at least one slit.

11. A circuit substrate with a built-in coil according to claim 1, wherein one of said magnetic materials has at least one slit.

12. A circuit substrate with a built-in coil according to claim 1, further comprising a second wiring circuit sheet disposed on a side of said coil component opposite to said at least one wiring sheet.

13. A circuit substrate with a built-in coil according to claim 12, wherein said wiring circuit sheet and said second wiring circuit sheet are both disposed spaced away from said at least one flat coil and said at least one magnetic material in a thickness direction of said circuit substrate.

14. A circuit substrate with a built-in coil according to claim 1, wherein said circuit pattern is electrically connected to at least one lead of said flat coil.

15. A circuit substrate with a built-in coil according to claim 14, wherein said circuit pattern is formed on two opposite sides of said wiring circuit sheet, said flat coil being electrically connected to said circuit pattern on an adjacent side of said wiring circuit sheet.

16. A circuit substrate with a built-in coil according to claim 15, wherein said wiring circuit sheet is disposed spaced away from said at least one flat coil and said at least one magnetic material in a thickness direction of said circuit substrate.

17. A circuit substrate with a built-in coil according to claim 1, wherein said wiring circuit sheet is disposed spaced away from said at least one flat coil and said at least one magnetic material in a thickness direction of said circuit substrate.

18. A circuit substrate with a built-in coil according to claim 1, wherein said wiring circuit sheet is flexible.

19. A circuit substrate with a built-in coil according to claim 18, wherein said wiring circuit sheet is made of polyimide.

* * * * *